(12) United States Patent
Nielsen et al.

(10) Patent No.: US 10,698,064 B2
(45) Date of Patent: Jun. 30, 2020

(54) MOTION-CORRECTED COMPRESSED SENSING MAGNETIC RESONANCE IMAGING

(71) Applicant: KONINKLIJKE PHILIPS N.V., Eindhoven (NL)

(72) Inventors: Tim Nielsen, Hamburg (DE); Peter Boernert, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 16/317,592

(22) PCT Filed: Jul. 14, 2017

(86) PCT No.: PCT/EP2017/067866
§ 371 (c)(1),
(2) Date: Jan. 14, 2019

(87) PCT Pub. No.: WO2018/015298
PCT Pub. Date: Jan. 25, 2018

(65) Prior Publication Data
US 2019/0242965 A1   Aug. 8, 2019

(30) Foreign Application Priority Data
Jul. 21, 2016 (EP) .................................... 16180581

(51) Int. Cl.
*G01V 3/00* (2006.01)
*G01R 33/565* (2006.01)
(Continued)

(52) U.S. Cl.
CPC ... *G01R 33/56509* (2013.01); *G01R 33/4818* (2013.01); *G01R 33/5608* (2013.01); *G01R 33/5611* (2013.01)

(58) Field of Classification Search
USPC ......................................................... 324/309
See application file for complete search history.

(56) References Cited

U.S. PATENT DOCUMENTS

2009/0175523 A1* 7/2009 Chen ..................... G06T 11/006
382/130
2009/0262996 A1* 10/2009 Samsonov .......... G01R 33/4818
382/130
(Continued)

OTHER PUBLICATIONS

Lustig et al "Compressed Sensing MRI" IEEE Signal Processing Magazine 25.2 (2008) p. 72-82.
(Continued)

*Primary Examiner* — Rodney E Fuller

(57) ABSTRACT

A magnetic resonance (MR) imaging system includes a memory for storing machine executable instructions and for storing pulse sequence commands to acquire the measured MR data according to a compressed sensing MR imaging protocol; and a processor for controlling the system. The MR imaging system with the pulse sequence commands acquires the measured MR data; reconstruct an intermediate MR image according to the compressed sensing MR imaging protocol; calculate a predicted data portion for each of the measured data portions; calculate a residual for each of the measured data portions; identify one or more of the measured data portions as outlier data portions; and reconstruct a corrected MR image according to the compressed sensing MR imaging protocol, wherein the one or more outlier data portions are excluded from the reconstruction of the corrected MR image.

15 Claims, 5 Drawing Sheets

(51) Int. Cl.
G01R 33/561 (2006.01)
G01R 33/48 (2006.01)
G01R 33/56 (2006.01)

(56) References Cited

U.S. PATENT DOCUMENTS

| | | | |
|---|---|---|---|
| 2011/0044524 A1* | 2/2011 | Wang | G01R 33/54 382/131 |
| 2013/0251225 A1 | 9/2013 | Liu et al. | |
| 2014/0035582 A1 | 2/2014 | Boernert et al. | |
| 2014/0125335 A1 | 5/2014 | Li et al. | |
| 2014/0210469 A1 | 7/2014 | Cheng et al. | |
| 2015/0033849 A1 | 2/2015 | Hanson et al. | |
| 2015/0077112 A1 | 3/2015 | Otazo et al. | |
| 2015/0198683 A1 | 7/2015 | Takeshima et al. | |
| 2016/0313416 A1* | 10/2016 | Nielsen | G01R 33/246 |
| 2016/0313431 A1 | 10/2016 | Beck et al. | |
| 2017/0307712 A1* | 10/2017 | Cai | G01R 33/5676 |
| 2019/0336033 A1* | 11/2019 | Takeshima | G06N 20/00 |

OTHER PUBLICATIONS

Mehdi H. Moghari et al:"Compressed-sensing motion compensation (CosMo): A joint prospective-retrospective respiratory navigator for coronary MRI", Magnetic Resonance in Medicine, vol. 66, No. 6, Jun. 10, 2011 (Jun. 10, 2011), pp. 1674-1681.

Jianing Pang et al: "Whole-heart coronary MRA with 100% respiratory gating efficiency: Self-navigated three-dimensional retrospective image-based motion correction (TRIM)", Magnetic Resonance in Medicine., vol. 71, No. 1,Feb. 7, 2013 (Feb. 7, 2013), pp. 67-74.

Mehmet Akçakaya et al:"Joint image reconstruction and motion parameter estimation for free-breathing navigator-gated cardiac MRI",SPIE-International Society for Optical Engineering. Proceedings, vol. 8858, Sep. 26, 2013 (Sep. 26, 2013),p. 885820.

Alexey A. Sams0nov et al: "POCS-enhanced correction of motion artifacts in parallel MRI", Magnetic Resonance in Medicine,vol. 63, No. 4, Apr. 1, 2010 (Apr. 1, 2010),pp. 1104-1110.

Feng Huang et al: "Data Convolution and Combination Operation (COCOA) for Motion Ghost Artifacts Reduction", Magnetic Resonance in Medicine, John Wiley & Sons, Inc, US, vol. 64, No. 1, Jul. 1, 2010 (Jul. 1, 2010), pp. 157-166.

Lustig et al "Sparse MRI: The Application of Compressed Sensing for Rapid MR Imaging" Magnetic Resonance in Med. 58: p. 1182-1195 (2007).

Markus Weiger et al "Motion-Adapted Gating Based on k-Space Weighting for Reduction of Respiratory Motion Artifacts" Magnetic Resonance in Medicine, vol. 38,Issue 2, p. 322-333 (Aug. 1997).

* cited by examiner

MOTION-CORRECTED COMPRESSED SENSING MAGNETIC RESONANCE IMAGING

CROSS REFERENCE TO RELATED APPLICATIONS

This application is a U.S. national phase application of International Application No. PCT/EP2017/067866, filed on Jul. 14, 2017, which claims the benefit of EP Application Serial No. 16180581.7 filed on Jul. 21, 2016 and is incorporated herein by reference.

FIELD OF THE INVENTION

The invention relates to magnetic resonance imaging, in particular to compressed sensing magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field.

One method of spatially encoding is to use magnetic field gradient coils. Typically there are three coils which are used to generate three different gradient magnetic fields in three different orthogonal directions.

During an MRI scan, Radio Frequency (RF) pulses generated by one or more transmitter coils cause a called B1 field. Additionally applied gradient fields and the B1 field do cause perturbations to the effective local magnetic field. RF signals are then emitted by the nuclear spins and detected by one or more receiver coils. These RF signals contain image data encoded in k-space. The central region of k-space generally contains more image information than outer regions of k-space. The Nyquist sampling theorem is a sufficient, but not necessary condition. Often times an acceptable magnetic resonance image can be reconstructed by sampling k-space less than is specified by the Nyquist theorem.

The review article Lustig, Michael, et al. "Compressed sensing MRI." IEEE Signal Processing Magazine 25.2 (2008): 72-82 describes a technique known as Compressed Sesnsing (CS) where Magnetic Resonance (MR) images are acquired using sparse sampling of k-space.

SUMMARY OF THE INVENTION

The invention provides for a magnetic resonance imaging system, a computer program product, and a method in the independent claims. Embodiments are given in the dependent claims.

Embodiments of the invention may provide for a means for improving the quality of magnetic resonance images produced using compressed sensing magnetic resonance imaging protocols. The reconstruction of images using CS is an iterative process. The resulting image will not necessarily match the original magnetic resonance data samples in k-space. The technique described herein uses those features of CS to identify data which may be compromised due to motion of the subject being imaged or corrupted due to other reasons. The acquired magnetic resonance data is first used to reconstruct an image according to a CS imaging protocol. This results in an intermediate magnetic resonance image. Next, this image is then used to calculate predicted k-space data (referred to as a predicted data portion herein). Sufficient data portions in k-space are measured to allow reconstruction of the intermediate magnetic resonance image. The intermediate magnetic resonance image may have a low spatial resolution, small field-of-view and when parallel imaging is used have a high folding degree. The better the quality of the intermediate magnetic resonance image, the more accurate the outliers can be identified and a smaller number of iterations in the compressed sensing reconstruction may be required to achieve a higher image quality. The intermediate magnetic resonance image is reconstructed from measured magnetic resonance signals, i.e. k-space data points or data portions (k-space profiles). Reconstructing the intermediate magnetic resonance image using the measured magnetic resonance data may include that the entire k-space coverage of the entire covered k-space is employed to reconstruct the intermediate magnetic resonance image. A subset of all actually measured data portions may be sufficient to reconstructed a low-resolution and/or low field-of-view intermediate magnetic resonance image.

With a single coil element, this would involve performing an inverse Fourier transform. If a parallel imaging technique is being used (i.e., the data used to reconstruct the intermediate image came from multiple coil elements) the coil sensitivities are first used to calculate predicted images resulting from each of the coil elements that were used. These predicted coil images are then inverse Fourier transformed to calculate predicted k-space data for each of the coil elements. In either case, the predicted k-space data can be directly compared to the measured k-space data. Image values of the intermediate magnetic resonance image and the predicted data portions are related according to the inverse of the relationship implied by the reconstruction of the intermediate magnetic resonance image and the measured data portions. In an example their relationship is the (inverse) Fourier transform, but different mathematical relationships may be employed to transform the measured data portions in the intermediate magnetic resonance image and back-transform the predicted data portions from the intermediate magnetic resonance image. For example (filtered) back-projections may be employed for the reconstruction of the intermediate magnetic resonance image and from the intermediate magnetic resonance image by forward projection the predicted data portions are calculated. The (filtered) back-projection is generally known form the field of computed tomography.

The magnetic resonance data is acquired within discrete time periods as measured portions (of k-space data). A residual is calculate for each of the time periods. If the residual for a time period is above a predetermined threshold, then the data from that time period is identified as being an outlier data portion. The identification of outliers is not sensitive to the underlying cause of the value the data portion deviating more than the predetermined threshold. That is, data portions may be identified as outliers irrespective of whether motion has occurred or due to another cause of inconsistency.

A corrected magnetic resonance image is then reconstructed using the acquired magnetic resonance data (the measured data portions). When this reconstruction is performed the outlier data portions are ignored or not used. In some cases the outlier data portions could be deleted or removed and the corrected magnetic resonance image could be completely recalculated. As was mentioned above, the CS technique is an iterative process. Numerically, it may therefore be more efficient to use the intermediate magnetic resonance image as the starting point for the reconstruction of the corrected magnetic resonance image, with the outlier data portions being ignored during this reconstruction.

In one aspect the invention provides for a magnetic resonance imaging system for acquiring measured magnetic resonance data from a subject within an imaging zone. The magnetic resonance imaging system comprises a memory for storing machine-executable instructions and for storing pulse sequence commands which are configured to control the magnetic resonance imaging system to acquire the measured magnetic resonance data according to a compressed sensing magnetic resonance imaging protocol.

The magnetic resonance imaging system further comprises a processor for controlling the magnetic resonance imaging system. Execution of the machine-executable instructions causes the processor to control the magnetic resonance imaging system with the pulse sequence commands to acquire the measured magnetic resonance data. The measured magnetic resonance data is acquired as measured data portions. Each of the measured data portions is acquired during a time period. Execution of the machine-executable instructions further causes the processor to reconstruct an intermediate magnetic resonance image using the measured magnetic resonance data according to the compressed sensing magnetic resonance imaging protocol. Execution of the machine-executable instructions further causes the processor to calculate a predicated data portion for each of the measured data portions using the intermediate magnetic resonance image. Execution of the machine-executable instructions further causes the processor to calculate a residual for each of the measured data portions using the predicted data portion.

The predicted data portion may for instance be determined by performing an inverse Fourier transform to calculate what the measured data would be like to generate the intermediate magnetic resonance image. These predicted data points in k-space can be directly compared to the measured data points within the measured data portions. The residual may therefore be considered as a measure which is used to compare the measured data with the predicted data. The residual can be calculated in different fashions. For instance every single data point can be compared and then a composite residual can be calculated using an average or for example an at least squared type function. Other statistical measures may also be used. In some examples portions of the k-space which are more important for generation of the image such as a central region of k-space can be weighted more heavily than data in the periphery of k-space.

In some instances, the data measured by the magnetic resonance imaging system may be acquired using more than one antenna element. For example the compressed sensing magnetic resonance imaging protocol might be a parallel imaging method. In this case calculating the predicted data portion may be more complicated. The weightings for calculating the image must be performed backwards and then used for calculating the data acquired by each antenna element. There may then be residuals for the data acquired by each antenna. The value of the residual could be found by looking for a maximal residual or some other statistical measure within the data for each of the antennas. For example if there was motion by a subject it is possible that the motion has only very heavily corrupted the data in one or several datasets from different antennas.

Execution of the machine-executable instructions further cause the processor to identify one or more of the measured data portions as outlier data portions if the residual is above a predetermined threshold. Depending on what measure the residual is the entire measured data portion is identified as outlier data portions. So if there is a parallel imaging technique data acquired by one antenna may cause data from all of the antenna or antenna elements to be identified as being outlier data portions. Execution of the machine-executable instructions further causes the processor to reconstruct a corrected magnetic resonance image using the measured magnetic resonance data according to the compressed sensing magnetic resonance imaging protocol.

The one or more outlier data portions are excluded from the reconstruction of the corrected magnetic resonance image. The exclusion of the one or more outlier data portions can be performed in different ways. In one instance the image can be completely reconstructed using the compressed sensed imaging protocol using only the data which was not identified as being outlier data portions. This however would be numerically intensive. Another alternative is that the compressed sensing protocol can be used to further refine the intermediate magnetic resonance image using all of the data except the outlier data portions. This would have the advantage of being less numerically intensive.

This embodiment may have the benefit that the compressed sensing protocol does a superior job of rejecting data in which the subject was moving during the time period for particular measured data portions. The movement of the subject may result in ghosting or aliasing artifacts within the intermediate magnetic resonance image. The process of calculating the residual does an effective job of identifying these data portions which contribute to motion artifacts.

In another embodiment, the compressed sensing magnetic resonance imaging protocol is a parallel imaging magnetic resonance imaging protocol. The magnetic resonance imaging system comprises a magnetic resonance imaging antenna with multiple antennas or antenna elements for acquiring the measured magnetic resonance data. During the time period the measured magnetic resonance data is acquired from each of the multiple antenna elements as an entire measured data portion. The residual is calculated for each of the multiple antenna elements for the time period.

For example, if the residual for each of the multiple antenna elements in each one of them is above a particular threshold or criteria then the data corresponding to that time period can be flagged as being outlier data portions. In compressed sensing the local sensitivities of the multiple antenna elements may cause some antenna elements to be more sensitive to motion of the subject than other antenna elements. By examining the residual from each of the multiple antenna elements this may provide for an improved method of identifying motion of a subject during the compressed sensing imaging.

In another embodiment, the residual is calculated for each of the multiple antenna elements individually. If a residual for one of the multiple antenna elements is above the predetermined threshold then the entire measured data portion is removed from the measured magnetic resonance data or is identified as an outlier data portion.

In another embodiment, the residual is an average over all of the multiple antennas. If the residual is above the predetermined threshold then the entire measured data portion is identified as one of the outlier data portions.

In another embodiment, the k-space data that is acquired according to the compressed sensing magnetic resonance imaging protocol within a particular time period is maximally spread using a distribution function. For example, the sample points in k-space could be distributed using a random or pseudo random function. In other cases, a more defined distribution such as the Poisson distribution could be used to centralize the k-space data or sample points within a central region of k-space.

In another embodiment, the intermediate magnetic resonance image is repeatedly reconstructed as one or more of the measured data portions is acquired. The predicted data portion is repeatedly calculated as the one or more measured data portions is acquired. The residual is repeatedly calculated as the one or more measured data portions is acquired. A measured data portion is repeatedly identified as an outlier data portion if the residual is above the predetermined threshold as the one or more measured data portions is acquired.

This embodiment may have the benefit that the outlier data portions are acquired on the fly as the measured magnetic resonance data is being acquired. This may enable the operator of the magnetic resonance imaging system to correct for problems or movement of the subject. It may also enable the operator (or control computer) to reacquire portions of the measured magnetic resonance data before the end of the acquisition of the measured magnetic resonance data. For example if the outlier data portions are identified after the acquisition of the data is finished it may be impossible to go back and reacquire the data with the subject in exactly the same position. This may then result in higher quality magnetic resonance images.

In another embodiment, the resolution of the intermediate magnetic resonance image is varied as an increasing number of the measured magnetic resonance data is acquired. During the acquisition of the measured magnetic resonance data only a portion of the k-space data is sampled. When there is a lower number of k-space samples the intermediate magnetic resonance image may still be constructed but it may have a lower resolution. As more of the measured magnetic resonance data is acquired the quality of the intermediate magnetic resonance image may be improved. This may have several consequences when only several of the measured data portions are acquired it may not be immediately evident that one of the measured data portions should be assigned to be an outlier data portion. However, as the amount of samples within k-space is increasing it is possible that some of the earlier measured data portions are then later assigned to outlier data portions. Changing the resolution of the intermediate magnetic resonance image may therefore enable a more dynamic and flexible method of identifying the outlier data portions.

In another embodiment execution of the machine-executable instructions further cause the processor to reacquire a measured data portion if it is identified as one of the outlier data portions. This may have the benefit of providing for an improvement in the quality of generated magnetic resonance images.

In another embodiment, the residual is calculated using a statistical measure to compare each of the measured data portions to the predicted data portion. For example the measured data portions may comprise individual measurements in k-space. These individual measurements within k-space can be compared to each other and a statistical measure may be used to calculate the residual.

In another embodiment, the statistical measure weights individual k-space measurements according to their location in k-space. This may be beneficial because it may provide for a means of providing k-space measurements which are more important to the image reconstruction to count more in the residual. For example within k-space the central region of k-space contains more signal power than the outer region of k-space. If the center of the k-space region is weighted more such as a distribution which favors the central region of k-space then this may provide a more accurate means of rejecting motion when reconstructing the corrected magnetic resonance image.

In another embodiment, execution of the machine-executable instructions further cause the processor to reconstruct at least one outlier magnetic resonance image using the one or more outlier data portions according to the compressed sensing magnetic resonance imaging protocol. In some instances the motion of the subject may be periodic or the subject may move or have an involuntary motion which goes between several positions. Using the magnetic resonance imaging data which was identified as being the outlier data portions may enable a method of compressed sensing imaging which is resolved about different motion states of the subject and which does not use a navigator or external sensor on the subject. The reconstruction of the at least one outlier magnetic resonance image could follow the same method as was used to construct the corrected magnetic resonance image where an intermediate outlier magnetic resonance image is constructed and then a residual is calculated in the same way. This way the various positions of the subject could be divided into a number of different images each which represent a different position of the subject.

It may also be possible to use a motion transform to identify different phases of the motion using the k-space data alone. In this case the k-space data could be divided into several groups and then these groups could be used to correct an outlier magnetic resonance image for each one of them.

In another embodiment, execution of the machine-executable instructions further causes the processor to set the corrected magnetic resonance image as the intermediate magnetic resonance image. Execution of the machine-executable instructions further cause the processor to repeat the calculation of the predicted portion, the identification of the one or more outlier data portions and the reconstruction of the corrected magnetic resonance image. In this embodiment once the corrected magnetic resonance image has been corrected, this can then be used to again search for additional outlier data portions. For example, if a subject moves and there is ghosting or some artifacts within the magnetic resonance image the portions of the magnetic resonance data which have the most motion in them would be identified as outlier data portions. Once the corrected magnetic resonance image has been reconstructed there may still be portions of the magnetic resonance data which contribute to artifacts or imperfections in the corrected magnetic resonance image. The corrected magnetic resonance image can then be used as the intermediate magnetic resonance image and the process can be started again.

The intermediate magnetic resonance image which was previously the corrected magnetic resonance image can then be used to create a new predicted data portion for each of the measured data portions using the intermediate magnetic resonance image. There can then be a new residual which is calculated for each of the remaining measured data portions using the new predicted data portion. Then finally, the measured data portions can then be re-examined to identify if one or more of them should be identified as outlier data portions based on the residual. For example if the residual is above a new predetermined threshold. After the measured data portions have been gone over again then a new corrected magnetic resonance image can be constructed using the measured magnetic resonance data according to the compressed sensing magnetic resonance imaging protocol and in this case the data which is then identified as the one or more outlier data portions are again excluded from the reconstruction of the corrected magnetic resonance image. However, in this case it is very likely that a larger portion of the measured magnetic resonance data is identified as belonging to the one or more outlier data portions.

Such a process may be repeated a number of times or it is also possible that the loop can be repeated several times and it can be seen if the corrected magnetic resonance image converges. For example, within several iterations the corrected magnetic resonance image from each iteration can be compared to the previous image and it can be seen using a statistical measure or measurement how much the two images vary. If the images vary below a threshold then the method can be considered to have converged.

In another embodiment, each of the measured data portion samples has a unique k-space sampling pattern. Instead of sampling the same k-space sampling with every measured data portion each of the measured data portion samples a different portion of the k-space.

In another aspect, the invention provides for a computer program product for execution by a processor controlling a magnetic resonance imaging system. The magnetic resonance imaging system is configured for acquiring measured magnetic resonance data of a subject from an imaging zone. Execution of the machine-executable instructions causes the processor to control the magnetic resonance imaging system with pulse sequence commands to acquire measured magnetic resonance data according to a compressed sensing magnetic resonance imaging protocol. The measured magnetic resonance data is acquired as measured data portions. Each of the measured data portions is acquired during a time period. Execution of the machine-executable instructions further causes the processor to reconstruct an intermediate magnetic resonance image using the measured magnetic resonance data according to the compressed sensing magnetic resonance imaging protocol.

Execution of the machine-executable instructions further cause the processor to calculate a predicted data portion for each of the measured data portions using the intermediate magnetic resonance image. Execution of the machine-executable instructions further cause the processor to calculate a residual for each of the measured data portions using the predicted data portion. Execution of the machine-executable instructions further cause the processor to identify one or more of the measured data portions as outlier data portions if the residual is above a predetermined threshold. Execution of the machine-executable instructions further causes the processor to reconstruct a corrected magnetic resonance image using the measured magnetic resonance data according to the compressed sensing magnetic resonance imaging protocol. The one or more outlier data portions are excluded from the reconstruction of the corrected magnetic resonance image.

In another aspect, the invention provides for a method of controlling a magnetic resonance imaging system. The magnetic resonance imaging system is configured for acquiring measured magnetic resonance data of a subject from the imaging zone. The method comprises controlling the magnetic resonance imaging system with pulse sequence commands to acquire the measured magnetic resonance data. The pulse sequence commands are configured to acquire the measured magnetic resonance data according to a compressed sensing magnetic resonance imaging protocol. The measured magnetic resonance data is acquired as measured data portions. Each of the measured data portions is acquired during a time period.

The method further comprises reconstructing an intermediate magnetic resonance image using the measured magnetic resonance data according to the compressed sensing magnetic resonance imaging protocol. The method further comprises calculating a predicted data portion for each of the measured data portions using the intermediate magnetic resonance image. The method further comprises calculating a residual for each of the measured data portions using the predicted data portion. The method further comprises identifying one or more of the measured data portions as outlier data portions if the residual is above a predetermined threshold. The method further comprises reconstructing a corrected magnetic resonance image using the measured magnetic resonance data according to the compressed sensing magnetic resonance imaging protocol. The one or more outlier data portions are excluded from the reconstruction of the corrected magnetic resonance image.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

Medical imaging data is defined herein as two or three dimensional data that has been acquired using a medical imaging system. A medical imaging system is defined herein as an apparatus adapted for acquiring information about the physical structure of a patient and construct sets of two dimensional or three dimensional medical imaging data. Medical imaging data can be used to construct visualizations which might be useful for diagnosis by a physician. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
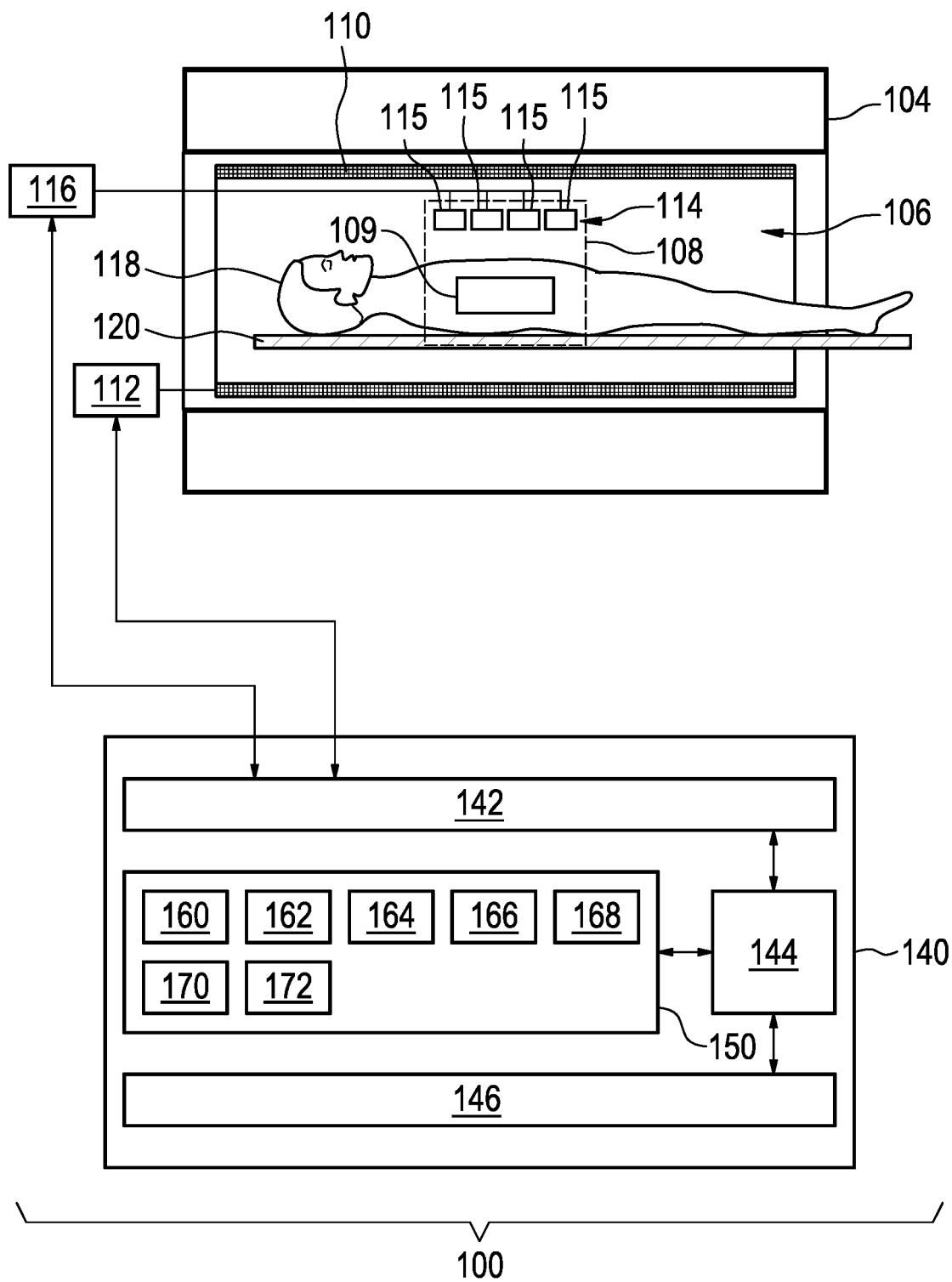
FIG. 1 illustrates an example of a magnetic resonance imaging system.

FIG. 1 illustrates an example of a magnetic resonance imaging system 100. The magnetic resonance imaging system comprises a main magnet 104, which may be referred to as the magnet. The magnet 104 is a superconducting cylindrical type magnet 104 with a bore 106 through it. The use of different types of magnets is also possible. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientation of magnetic spins within the imaging zone 108 and for receiving radio transmissions from spins also within the imaging zone 108. The radio frequency coil may also be referred to as a radio frequency antenna or antenna. The radio frequency antenna may contain multiple coil elements. The multiple coil elements may also be referred to as a antenna elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receiver. In this example, the radio-frequency coil 114 may also have multiple receive/transmit coil elements and the radio frequency transceiver 116 haves multiple receive/transmit channels.

The radio-frequency coil 114 is shown as comprising a number of coil elements 115. The coil elements 115 may be used to acquire magnetic resonance data separately. The radio-frequency coil 114 may therefore be used for a parallel imaging magnetic resonance technique. Although it is not shown in this Fig, the magnetic resonance imaging system 100 may also comprise a body coil. The body coil would be useful in the parallel imaging technique as it could take acquired data at the same time as the individual coil elements 115 and be used for calculating a set of coil sensitivities.

The magnetic resonance data may be acquired from within the imaging zone 108. In many cases the region of the imaging zone 108 is limited to a region of interest 109. An exemplary region of interest is depicted in the FIG. It can be seen that different coil elements 115 are different distances from the region of interest 109. Different coil elements 115 will therefore be more or less sensitive to various motion of the subject 118.

Within the bore 106 of the magnet 104 there is a subject support 120 which supports the subject in the imaging zone 108. A region of interest 109 can be seen within the imaging zone 108.

The transceiver 116 and the gradient controller 130 are shown as being connected to a hardware interface 142 of a computer system 140. The computer system further comprises a processor 144 that is in communication with the hardware system 142, memory 150, and a user interface 146. The memory 150 may be any combination of memory which is accessible to the processor 144. This may include such things as main memory, cached memory, and also non-volatile memory such as flash RAM, hard drives, or other storage devices. In some examples the memory 150 may be considered to be a non-transitory computer-readable medium. The memory 150 is shown as storing machine-executable instructions 160 which enable the processor 144 to control the operation and function of the magnetic resonance imaging system 100. The memory 150 is further shown as containing pulse sequence commands 162. Pulse sequence commands as used herein encompass commands or a timing diagram which may be converted into commands which are used to control the functions of the magnetic resonance imaging system 100 as a function of time. Pulse sequence commands are the implementation of the magnetic resonance imaging protocol applied to a particular magnetic resonance imaging system 100.

The pulse sequence commands 162 may be in the form of commands which the processor 144 sends to the various components of the magnetic resonance imaging system 100 or they may be data or Meta data which is converted into commands that the processor 144 uses to control the magnetic resonance imaging system 100.

The computer memory 150 is further shown as containing a number of measured data portions 164 which make up the measured magnetic resonance data. The computer storage 150 is further shown as containing a set of coil sensitivities 166. The presence of the coil sensitivities 166 is optional. In the case where there is a single antenna there may not be any coil sensitivities present. The coil sensitivities may be measured by comparing an image generated from magnetic resonance data from each of the coil elements in comparison to an image generated from a body coil. The set of coil sensitivities 166 may also be determined in some cases in the course of generating an image according to the compressed sensing magnetic resonance imaging protocol.

The computer memory 150 is further shown as containing an intermediate magnetic resonance image that was reconstructed using the compressed sensing magnetic resonance imaging protocol and the measured data portions 164. The computer memory 150 is further shown as containing predicted data portions 170. The predicted data portions 170 may be determined by performing an inverse Fourier transform of the intermediate magnetic resonance image 168 to predict the measured values in k-space. In the case where there are multiple coil elements 115 a predicted coil image may be first calculated by using a set of coil sensitivities to infer a predicted contribution to the overall intermediate magnetic resonance image.

The intermediate or predicted coil image may then be Fourier transformed to calculate the predicted data portions for each individual coil element or antenna element 115. The predicted data portions 170 may then be compared to each measured data portion 164 and a residual 172 either for the overall process or for each individual antenna element 115. The residual 172 may then be used in conjunction with the predetermined threshold 174 to identify a number of outlier data portions 176 from the measured data portions. The computer memory is further shown as containing a corrected magnetic resonance image 178. The corrected magnetic resonance image is constructed using the measured data portions 164 excluding the outlier data portions 176. This may be performed in a number of different ways. In one case the corrected magnetic resonance image may be completely reconstructed using a compressed sensing magnetic resonance imaging protocol to reconstruct the image where the outlier data portions 176 have been removed from the measured data portions 164.

In other cases the intermediate magnetic resonance image 168 may be used as the starting point for the iterative process of constructing the image according to a compressed sensing magnetic resonance imaging protocol. The outlier data portions 176 are not used in the reconstruction of the corrected magnetic resonance image 178, however, they were used in the intermediate magnetic resonance image 168 that was used as the seed or starting point for the numerical iterations of calculating the corrected magnetic resonance image 178.

Figure 2:
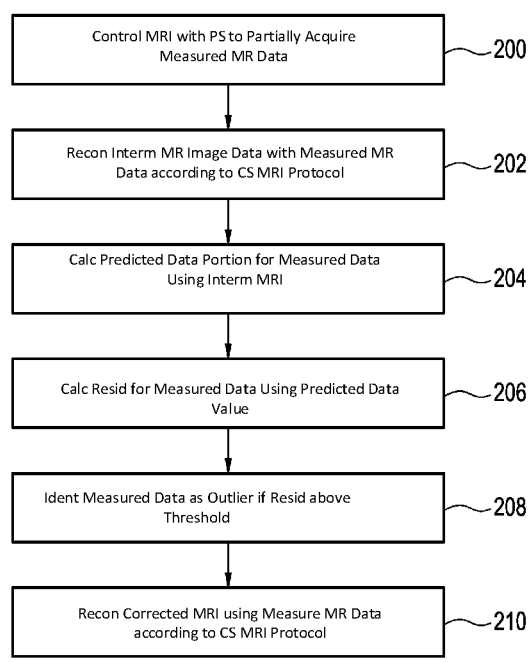
FIG. 2 illustrates a further method of using the magnetic resonance imaging system of FIG. 1.

FIG. 2 shows a flowchart which illustrates a method of operating the magnetic resonance imaging system 100 of FIG. 1. The steps shown in FIG. 2 could for example be implemented by the machine-executable instructions 160. First in step 200 the magnetic resonance imaging system 100 is controlled with the pulse sequence commands 162 to acquire the measured magnetic resonance data. The measured magnetic resonance data is acquired as measured data portions 164. Each of the measured data portions is acquired during a time period. Next in step 202 the intermediate magnetic resonance image 168 is reconstructed using the measured magnetic resonance data 164 according to a compressed sensing magnetic resonance imaging protocol.

Next in step 204 the predicted data portion 170 is calculated for each of the measured data portions 164 using the intermediate magnetic resonance image. As was mentioned before, this may be done using an inverse Fourier transform to predict the measured data. Next in step 206 a residual 172 is calculated for each of the measured data portions 164 using the predicted data portion 170. Next in step 208 one or more outlier data portions 176 are identified from measured data portions that have a residual 172 that is above a predetermined threshold 174. Finally, in step 210 the corrected magnetic resonance image 178 is reconstructed using the measured magnetic resonance data 164 according to the compressed sensing magnetic resonance imaging protocol. This is done by excluding the outlier data portions 176 from the image reconstruction. As was also mentioned above, this may be performed in several different ways.

Figure 3:
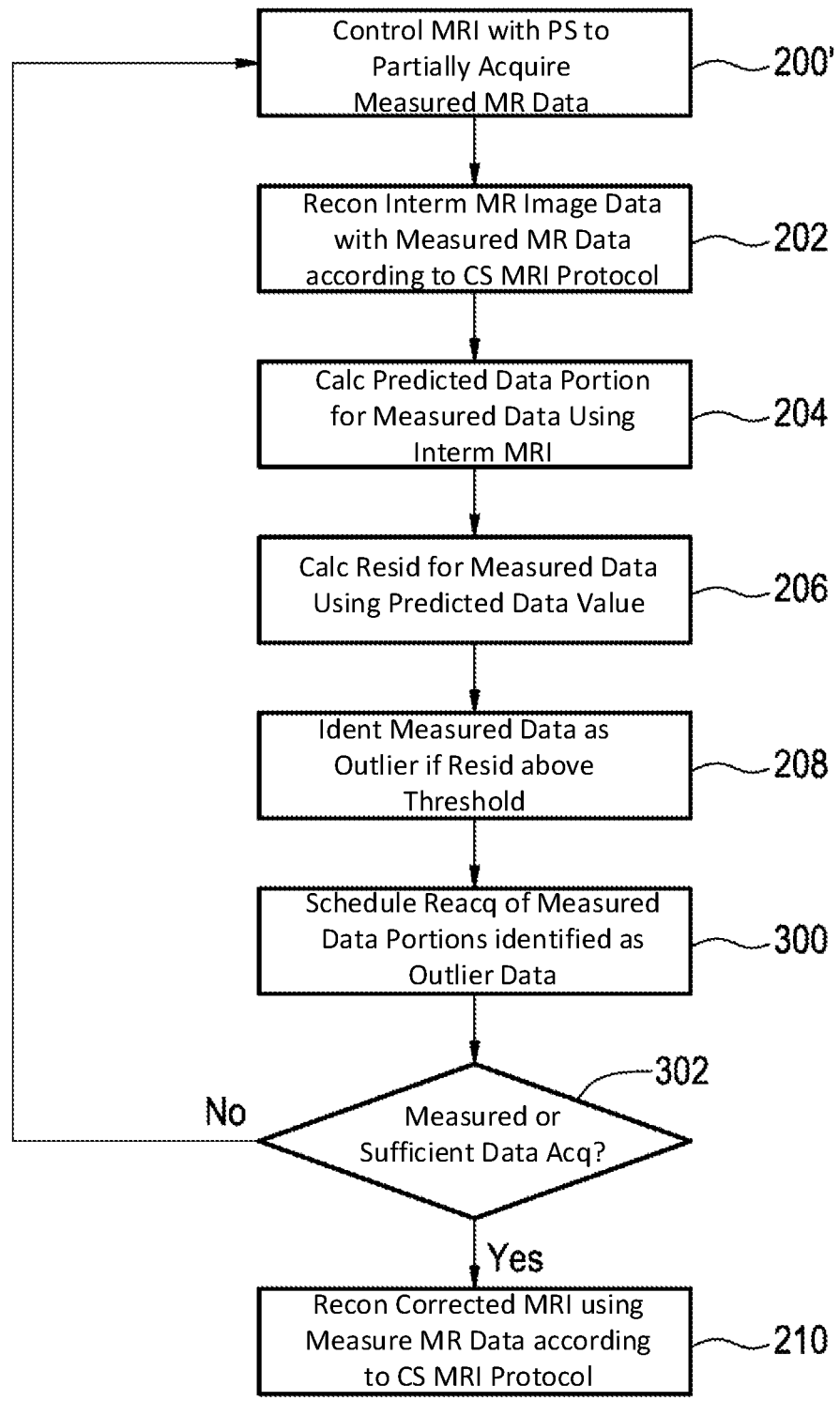
FIG. 3 illustrates a further method of using the magnetic resonance imaging system of FIG. 1.

FIG. 3 shows a flowchart which illustrates a further method of operating the magnetic resonance imaging system 100 of FIG. 1. The method begins with step 200'. In step 200' the magnetic resonance imaging system 100 is controlled with the pulse sequence commands 162 such that only a portion of the measured magnetic resonance data is acquired. This may be one or more measured data portions 164. Steps 202-208 are identical with those as are shown in FIG. 2 except the method is performed with all of the measured data portions that have been acquired as opposed to the complete measured magnetic resonance data. After step 208 has been performed step 300 is performed. In step 300 the scheduling of the reacquisition of measured data portions that were identified as outlier data portions is performed. The method then proceeds to decision box 302. Decision box 302 may answer several different questions. A first question would be have all measured data portions been acquired. If the answer is yes then the method proceeds to step 210 and a corrected magnetic resonance image is constructed.

If the answer is no then the method returns back to step 200' and another group of one or more measured data portions is acquired. As an alternative, the decision box 302 may also ask the question has sufficient magnetic resonance data been acquired. If the answer is yes then the method again proceeds to step 210. If the answer is no then the method proceeds back to step 200' also. The compressed sensing magnetic resonance imaging protocols are able to reconstruct a magnetic resonance image without the complete acquisition of k-space. In some cases it may be sufficient to simply drop or ignore the data which was identified as outlier data portions. However, if too many outlier data portions are identified then it may be beneficial to go through and acquire one or more of the identified outlier data portions.

Figure 4:
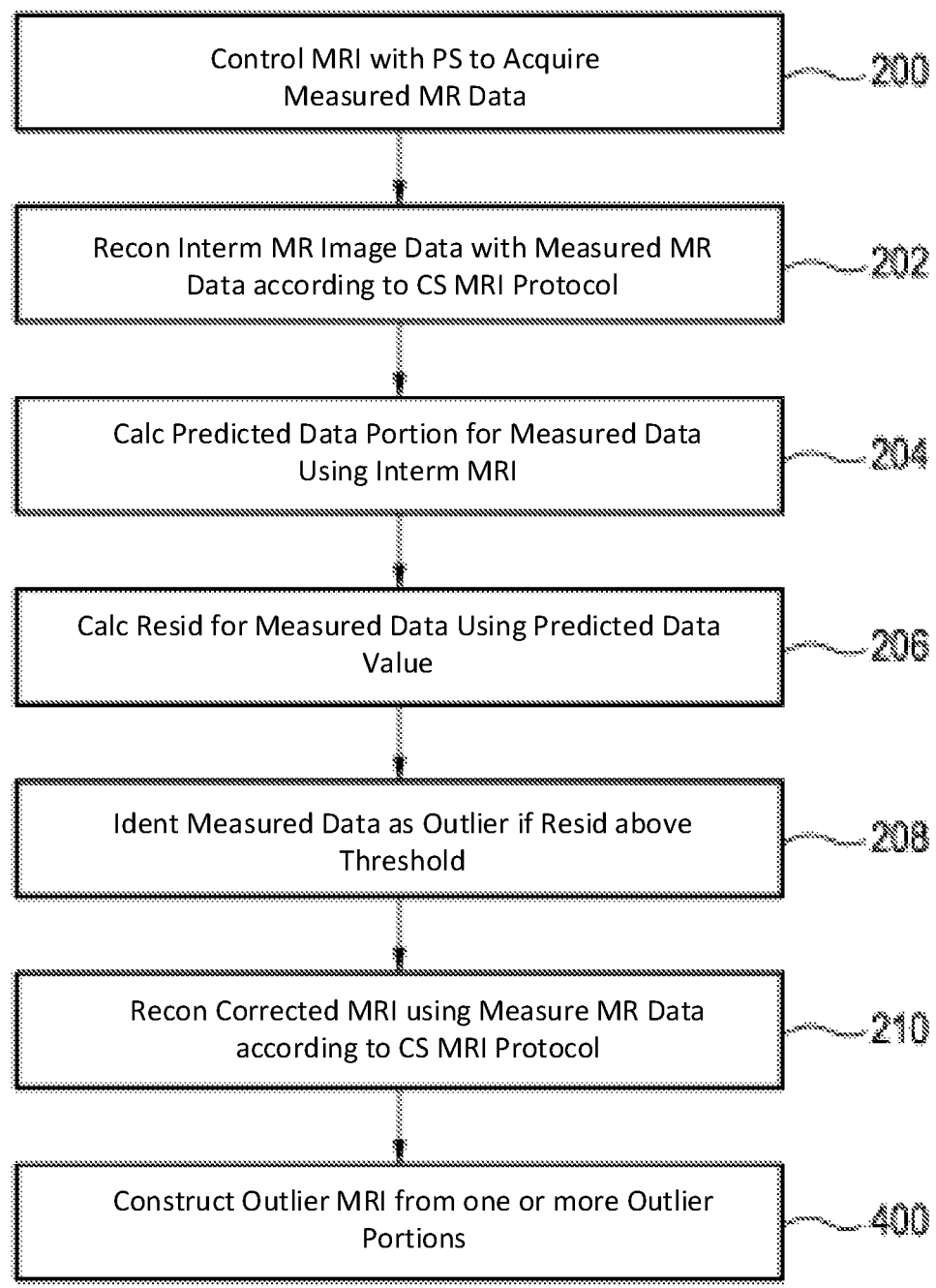
FIG. 4 illustrates a further method of using the magnetic resonance imaging system of FIG. 1.

FIG. 4 shows a further method of operating the magnetic resonance imaging system 100 of FIG. 1. The method in FIG. 4 is similar to that shown in FIG. 2 with an additional step performed after step 210. Step 400 is performed after step 210. In step 400 one or more outlier magnetic resonance images is constructed from the one or more outlier data portions. It should be noted that the outlier data portions may be treated as separately acquired magnetic resonance data and used separately to construct an intermediate magnetic resonance image and residual and corrected magnetic resonance image as is illustrated in FIG. 2. In some cases the residual could be due to transient motion by the subject 118. However, in some cases the residual being above the predetermined threshold may be due to periodic or involuntary periodic motion of the subject 118. In this case the outlier data portions could be used to make a series of images that represent different phases of the subject's 118 periodic motion.

Figure 5:
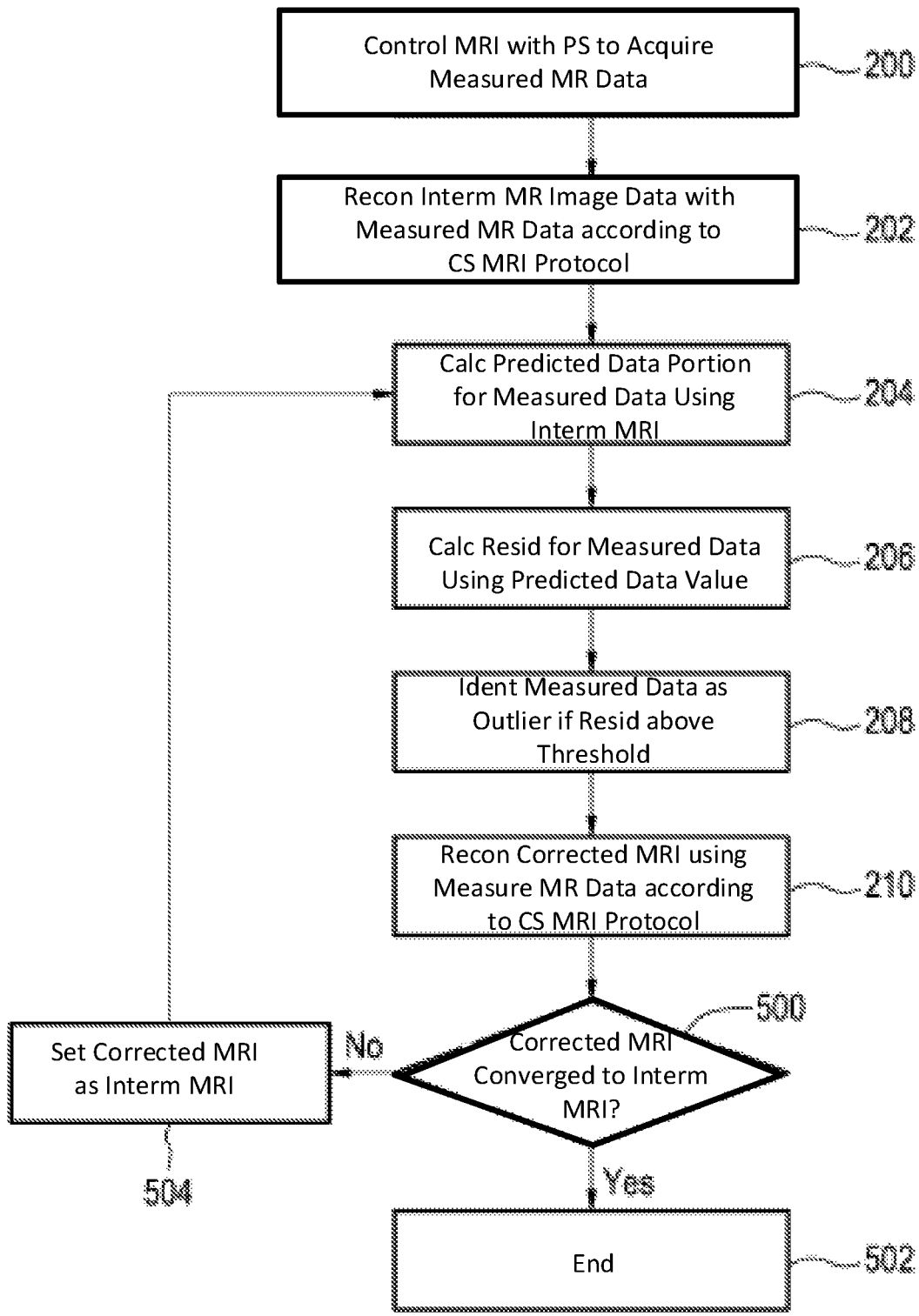
FIG. 5 illustrates a further method of using the magnetic resonance imaging system of FIG. 1.

FIG. 5 shows a flowchart which illustrates a further method of operating the magnetic resonance imaging system of FIG. 1. The method shown in FIG. 5 is similar to the method illustrated in FIG. 2. The steps 200-210 are performed as they are in FIG. 2. After step 210 the method proceeds to step 500. Step 500 is a decision box where a test of convergence between the corrected magnetic resonance image and the intermediate magnetic resonance image is performed. If the corrected magnetic resonance image has converged to the intermediate magnetic resonance image within a predetermined measure or statistical test then the method proceeds to step 502 and the method ends. If the two images have not converged sufficiently then the method proceeds to step 504. In step 504 the corrected magnetic resonance image is set as being the intermediate magnetic resonance image and the method returns to step 204.

The predicted data portion is recalculated for each of the measured data portions using what was previously the corrected magnetic resonance image. The method then proceeds normally through steps 206, 208 and step 210 again. In step 208 as the intermediate magnetic resonance image has changed there may be more data portions that are identified as outlier data portions. In this example method the measured data portions which were previously identified as outlier data portions in other iterations may continue to be identified as outlier data portions. However, in some other examples of this method the steps of calculating residual and a predicted data portion might be repeated for every single measured data portion for every iteration. The method then proceeds to step 500. If the images have converged then the method ends in step 502 and if not the iterations may continue by proceeding back to step 504. In some examples a maximum number of iterations may be set.

CS reconstruction is an iterative reconstruction where the difference between measured data and re-projected image is used to calculate an image update (which is subject to a given sparsity constraint). Motion during data acquisition will cause image artifacts because the reconstruction algorithm tries to merge conflicting data into a single image. Because CS typically uses fewer data than standard reconstruction its sensitivity towards motion artifacts is higher than that of standard reconstruction.

Examples may improve the stability of CS reconstruction against motion artifacts by introducing a simple model for motion. The intermediate magnetic resonance image represents the static temporal phase of the object, and in this way this model distinguishes a static temporal phase of the object, in which the object is at rest, from a possible motion phase: It is possible that data points from the static phase are taken into account in the calculation of the image update and data points acquired during the motion phase are ignored. The measured data portions are acquired during distinct time periods. The measured data portions identified as the outlier data portions may represent times when the object is possibly in motion.

Compressed sensing (CS) reconstruction imposes sparsity of the reconstructed image in a (suitably chosen) domain. This is an additional requirement next to the usual criterion that the reconstructed image is in agreement with the measured data. Consequently, CS allows reconstruction of images from fewer data than standard reconstruction and thus enables accelerated imaging or allows reconstructing an image in cases where available data is limited.

Examples may reduce ghosting artifacts caused by motion during data acquisition during CS.

As mentioned above, examples may improve the stability of CS reconstruction against motion artifacts by introducing a simple model for motion. This model distinguishes a static temporal phase of the object from a possible motion phase: Preferably data points from the static phase/period are taken into account in the calculation of the image update and data points acquired during the motion phase are ignored.

The segmentation of the data set into static and motion temporal phase can be done in several ways:
a) by using data from an external sensor (e.g. camera, respiratory belt, PPU, . . . ) This method is very efficient because it can be applied before the actual reconstruction starts, but it has the drawback that an additional sensor is required.
b) by using the measurement data themselves and identifying the measured data portions: To this end, the distribution of the difference between measured data (measured data portions) and re-projected image in the form of the residual is analyzed. Standard CS reconstruction has only one way to process this difference: Compute an image update from it.

Examples may introduce data rejection as an additional option into the CS algorithm: If the pattern of differences is correlated to the temporal pattern of the data acquisition, it is likely that motion was the cause for this difference. In this case, that part of the data set can be rejected (=assigned to the motion phase) and be ignored in the further reconstruction. The rejected or ignored data may be assigned to being outlier data portions. In this way motion artifacts can be substantially reduced.

An MRI scan is performed using variable density sampling and appropriate subsampling. Based on these data a CS reconstruction is started.
Different CS-algorithm implementations are conceivable.
(1) First based on all available data an intermediate magnetic resonance image is reconstructed using the iterative CS reconstruction algorithm. This algorithm uses a sparcifying transform and corresponding regularisation. The necessary coil sensitivity information can be derived from the central part of the k-space data. All measured data is initially considered to be correct. This means during the iterative procedure only the data at position that have not been measured are updated.
(2) At a certain level of convergence, the data rejection (identification of the outlier data portions) is activated (next to the image update computation): The residual is summed for all data acquired in a short time interval (e.g. one TSE shot) and the residual pattern is analyzed to check for motion events.
For this step the natural temporal footprint information for each profile is used to identify individual but also temporally correlated outliers stemming from the same time interval influenced by the same motion event. Those are downweighed or rejected in the following procedure.

(3) The CS iterations are continued until a certain level of consistency or a minimum number of data to be trusted is reached and the iteration is stopped.

This process can be further improved by up-dating also coil sensitivity maps (CSM), because also those might be subject of artifacts in case of motion. In that way also the CSM are estimated from the data (via auto-calibration) embedded in the iterative procedure to identify and potentially fully reject inconsistent measurement data to finally reconstruct an artifact free image. If lines from central areas are not subject to motion, updating CSMs is not necessary.

A further ingredient is the proper choice of the temporal footprint of the corresponding profiles. I.e. not only the sampling pattern in k-space is important but also the temporal order of data acquisition: After the generation of the variable density sampling pattern for CS the individual samples have to be distributed in time appropriately. Here considerations about the desired image contrast are important as well as appropriate sampling diversity. This means that subsequently acquired k-space samples, which potentially could be grouped into individual temporal footprints, are largely distributed over k-space to avoid too large under sampling resulting in local holes of large extent in k-space making reconstruction very unstable.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance system
104 main magnet
106 bore of magnet
108 imaging zone
109 region of interest
110 magnetic field gradient coils
112 gradient coil power supply
114 radio-frequency coil
115 coil element
116 transceiver
118 subject
120 subject support
122 structural support
124 modulator
126 switch unit
128 current charger
130 gradient controller
132 connection
134 gradient coil cooling system
136 magnetic field sensor
140 computer system
142 hardware interface
144 processor
146 user interface
150 computer memory
160 machine executable instructions
162 pulse sequence commands
164 measured data portion
166 set of coil sensitivities
168 intermediate magnetic resonance image
170 predicted data portions
172 residual
174 predetermined threshold
176 outlier data portion
178 corrected magnetic resonance image
200 control the magnetic resonance imaging system with the pulse sequence commands to acquire the measured magnetic resonance data
200' control the magnetic resonance imaging system with the pulse sequence commands to partially acquire the measured magnetic resonance data
202 reconstruct an intermediate magnetic resonance image using the measured magnetic resonance data according to the compressed sensing magnetic resonance imaging protocol
204 calculate a predicted data portion for each of the measured data portions using the intermediate magnetic resonance image
206 calculate a residual for each of the measured data portions using the predicted data portion
208 identify one or more of the measured data portions as outlier data portions if the residual is above a predetermined threshold
210 reconstruct a corrected magnetic resonance image using the measured magnetic resonance data according to the compressed sensing magnetic resonance imaging protocol
300 Schedule the reacquisition of measured data portions identified as outlier data portions
302 have all measured data portions been acquired? Or has sufficient magnetic resonance data been acquired?
400 construct one or more outlier magnetic resonance image from the one or more outlier data portions
500 has the corrected magnetic resonance image converged to the intermediate magnetic resonance image within a predetermined measure?
502 end
504 set the corrected magnetic resonance image as the intermediate magnetic resonance image

The invention claimed is:

1. A magnetic resonance imaging system for acquiring measured magnetic resonance data of a subject from an imaging zone, wherein the magnetic resonance imaging system comprises:
a memory for storing machine executable instructions and for storing pulse sequence commands to acquire the measured magnetic resonance data according to a compressed sensing magnetic resonance imaging protocol; and
a processor for controlling the magnetic resonance imaging system, wherein execution of the machine executable instructions cause the processor to:
control the magnetic resonance imaging system with the pulse sequence commands to acquire the measured magnetic resonance data, wherein the measured magnetic resonance data is acquired as measured data portions, wherein each of the measured data portions is acquired during a time period;

reconstruct an intermediate magnetic resonance image using the measured magnetic resonance data according to the compressed sensing magnetic resonance imaging protocol;

calculate a predicted data portion for each of the measured data portions using the intermediate magnetic resonance image;

calculate a residual for each of the measured data portions using the predicted data portion;

identify one or more of the measured data portions as outlier data portions if the residual is above a predetermined threshold; and reconstruct a corrected magnetic resonance image using the measured magnetic resonance data according to the compressed sensing magnetic resonance imaging protocol, and wherein the one or more outlier data portions are excluded from the reconstruction of the corrected magnetic resonance image.

2. The magnetic resonance imaging system of claim 1, wherein the compressed sensing magnetic resonance imaging protocol is a parallel imaging magnetic resonance imaging protocol, wherein the magnetic resonance imaging system comprises a magnetic resonance imaging antenna with multiple antenna elements for acquiring the measured magnetic resonance data, wherein during the time period the measured magnetic resonance data is acquired from each of the multiple antenna elements as an entire measured data portion, and wherein the residual is calculated for each of the multiple antenna elements for the time period.

3. The magnetic resonance imaging system of claim 2, wherein the residual is calculated for each of the multiple antennas individually, wherein if a residual for one of the multiple antennas is above the predetermined threshold then the entire measured data portion is identified as one of the outlier data portions.

4. The magnetic resonance imaging system of claim 2, wherein the residual is an average over all of the multiple antennas, wherein if the residual is above the predetermined threshold then the entire measured data portion is identified as one of the outlier data portions.

5. The magnetic resonance imaging system of claim 1, wherein the k-space data acquired according to the compressed sensing magnetic resonance imaging protocol within a particular time period is maximally spread in k-space using a distribution function.

6. The magnetic resonance imaging system of claim 5, wherein the intermediate magnetic resonance image is repeatedly reconstructed as one or more of the measured data portions is acquired, wherein the predicted data portion is repeatedly calculated as the one or more measured data portions is acquired, wherein the residual is repeatedly calculated as the one or more measured data portions is acquired, and wherein the measured data portion is repeatedly identified as one of the outlier data portions if the residual is above the predetermined threshold as the one or more measured data portions is acquired.

7. The magnetic resonance imaging system of claim 6, wherein the resolution of the intermediate magnetic resonance image is varied as an increasing number of the measured magnetic resonance data is acquired.

8. The magnetic resonance imaging system of claim 1, wherein execution of the machine executable instructions causes the processor to re-acquire a measured data portion if it is identified as one of the outlier data portions.

9. The magnetic resonance imaging system of claim 1, wherein the residual is calculated using a statistical measure to compare each of the measured data portions to the predicted data portion.

10. The magnetic resonance imaging system of claim 9, where the statistical measure weights individual k-space measurements according to their location in k-space.

11. The magnetic resonance imaging system of claim 1, wherein execution of the machine executable instructions further cause the processor to reconstruct at least one outlier magnetic resonance image using the one or more outlier data portions according to the compressed sensing magnetic resonance imaging protocol.

12. The magnetic resonance imaging system of claim 1, wherein execution of the machine executable instructions further causes the processor to:

set the corrected magnetic resonance imaging as the intermediate magnetic resonance image; and repeat the calculation of the predicted portion, the identification of the one or more outlier data portions, and the reconstruction of the corrected magnetic resonance image.

13. The magnetic resonance imaging system of claim 1, wherein the each of the measured data portions samples has a unique k-space sampling pattern.

14. A computer program product comprising machine executable instructions stored on a non-transistory computer readable medium for execution by a processor controlling a magnetic resonance imaging system, wherein the magnetic resonance imaging system is configured for acquiring measured magnetic resonance data of a subject from an imaging zone, wherein execution of the machine executable instructions cause the processor to:

control the magnetic resonance imaging system with pulse sequence commands to acquire measured magnetic resonance data according to a compressed sensing magnetic resonance imaging protocol, wherein the measured magnetic resonance data is acquired as measured data portions, wherein each of the measured data portions is acquired during a time period;

reconstruct an intermediate magnetic resonance image using the measured magnetic resonance data according to the compressed sensing magnetic resonance imaging protocol;

calculate a predicted data portion for each of the measured data portions using the intermediate magnetic resonance image;

calculate a residual for each of the measured data portions using the predicted data portion;

identify one or more of the measured data portions as outlier data portions if the residual is above a predetermined threshold; and reconstruct a corrected magnetic resonance image using the measured magnetic resonance data according to the compressed sensing magnetic resonance imaging protocol, and wherein the one or more outlier data portions are excluded from the reconstruction of the corrected magnetic resonance image.

15. A method of controlling a magnetic resonance imaging system, wherein the magnetic resonance imaging system is configured for acquiring measured magnetic resonance data of a subject from an imaging zone, wherein the method comprises:

controlling the magnetic resonance imaging system with pulse sequence commands to acquire the measured magnetic resonance data, wherein the pulse sequence commands are configured to acquire the measured magnetic resonance data according to a compressed sensing magnetic resonance imaging protocol, wherein the measured magnetic resonance data is acquired as measured data portions, wherein each of the measured data portions is acquired during a time period;

reconstructing an intermediate magnetic resonance image using the measured magnetic resonance data according to the compressed sensing magnetic resonance imaging protocol;

calculating a predicted data portion for each of the measured data portions using the intermediate magnetic resonance image;

calculating a residual for each of the measured data portions using the predicted data portion;

identifying one or more of the measured data portions as outlier data portions if the residual is above a predetermined threshold; and reconstructing a corrected magnetic resonance image using the measured magnetic resonance data according to the compressed sensing magnetic resonance imaging protocol, and wherein the one or more outlier data portions are excluded from the reconstruction of the corrected magnetic resonance image.

* * * * *